United States Patent
Kung et al.

(10) Patent No.: US 6,881,662 B2
(45) Date of Patent: Apr. 19, 2005

(54) PATTERN FORMATION PROCESS FOR AN INTEGRATED CIRCUIT SUBSTRATE

(75) Inventors: Moriss Kung, Taipei (TW); Kwun-Yao Ho, Taipei (JP)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/211,700

(22) Filed: Aug. 2, 2002

(65) Prior Publication Data

US 2003/0190799 A1 Oct. 9, 2003

(30) Foreign Application Priority Data

Apr. 10, 2002 (TW) ........................................ 91107134 A

(51) Int. Cl.[7] .......................................... H01L 21/4763
(52) U.S. Cl. ...................... 438/629; 438/612; 438/108; 438/622; 438/625; 438/666; 438/667; 438/623
(58) Field of Search .................. 438/629, 612, 438/108, 22, 113, 125, 30, 27, 29, 626, 625, 622, 633, 666, 667

(56) References Cited

U.S. PATENT DOCUMENTS

| | | | | | |
|---|---|---|---|---|---|
| 5,118,385 | A | * | 6/1992 | Kumar et al. | 216/18 |
| 5,122,227 | A | * | 6/1992 | Ott | 438/3 |
| 5,382,315 | A | * | 1/1995 | Kumar | 216/39 |
| 5,877,076 | A | * | 3/1999 | Dai | 438/597 |
| 5,891,527 | A | * | 4/1999 | Turek et al. | 427/448 |
| 6,163,957 | A | * | 12/2000 | Jiang et al. | 29/852 |
| 6,521,533 | B1 | * | 2/2003 | Morand et al. | 438/687 |
| 6,640,434 | B1 | * | 11/2003 | Wojewnik et al. | 29/846 |
| 2003/0203705 | A1 | * | 10/2003 | Leng | 451/36 |

* cited by examiner

*Primary Examiner*—Matthew Smith
*Assistant Examiner*—Igwe U. Anya

(57) ABSTRACT

A pattern formation process for an integrated circuit substrate, which is not employing the conventional method of filling resin material directly in via filling process but adapting the metal spray method, the metal vapor deposition method or any combination thereof to form the pattern including circuits and pads and stuff the vias and the through holes.

4 Claims, 10 Drawing Sheets

PATTERN FORMATION PROCESS FOR AN INTEGRATED CIRCUIT SUBSTRATE

BACKGROUND OF THE INVENTION (a) Field of the invention

The present invention relates to a pattern formation process for an integrated circuit substrate. Especially, the present invention relates to a pattern formation process that uses the metal spray method, the metal vapor deposition method or any combination thereof applying on the integrated circuit substrate to stuff the vias and PTHs ((Plated Through Holes) and to form the pattern including circuits and pads.

(b) Description of the Prior Art

As the electronic product getting smaller and lighter, the circuit board and the substrate manufacturer now are facing the strict requirement for multiple layers integrated circuit substrate. The circuit layout placed on the substrate is using the vias and the PTHs to connect and conduct each other. Basically, the PTH is fully penetrating through a substrate, while a via is not when several substrates added together. In general, the diameter of the via or the PTH is less than 100 μm and its line width is less than 50 μm. However, for the purpose of the density and the precision, the technology for manufacturing the micro via or the PTH with high density and high precision on the single or multiple layers integrated circuit substrate has been developed rapidly. And as the circuit board being wildly used, with higher depth/width ratio, manufacturing PTH with good electrical characteristic on a substrate with high precision is the major concern for many manufacturers.

Please refer to FIG. 1A to FIG. 1E, which showing the manufacture process to produce the via on an integrated circuit substrate in prior art, as shown, the process is including the steps as follows:

(a) providing a basic material as the main body of integrated circuit substrate 10, and on the top and the bottom side of the integrated circuit substrate 10, placing the top and bottom metal layers 11 and 12 used to define the circuit layout later;

(b) allocating the position of the PTHs on the predetermined position on the surface of the integrated circuit substrate 10, punching by the mechanical drilling to form a plurality of through holes 13 on the integrated circuit substrate 10;

(c) plating a complete plane with copper 14 in the inner side of the through holes 13 to form the electrical conducting PTHs (Plated Trough Hole) 13a;

(d) proceeding Photolithograph, etching process on the circuit structure that being defined on the top and the bottom metal layer 11 and 12 on the top and the bottom surface of the integrated circuit substrate 10 to define the top and the bottom circuit layer 11a and 12a.

(e) proceeding the filling process on the PTH 13a by filling up the PTH 13a with a resin material such as the solder mask to form the complete structure of conducting plug 14, and the last step is to place the protection layer on the surface of the top and the bottom circuit layer 11a and 12a of the integrated circuit substrate 10 for protection purpose.

The description above is the general manufacturing process for a single layer integrated circuit substrate. Basically, defining the PTHs in the aforesaid process for the single layer integrated circuit substrate and stacking the single layer integrated circuit substrates together will form the complex multiple layers integrated circuit substrate.

The process described above has been developed for many years in prior art, however, the disadvantages still exist; such as bad reliability, bad yield and so on. The major causes are as follows, 1. The solder mask is the most common used material in filling process fro the PTH 14, it is easy to form the gap space in the conducting plug 15 and to produce the popcorn, and further cause the difficulties of filling, the limitation of the diameter of the via, bad quality of electrical connection and bad reliability.

2. Making high quality via is a extremely complex process, the time for making such product is much longer, the manufacturing facility needed is expensive and the manufacturing cost is also high.

As the descriptions, the integrated circuit substrate that being made thru the conventional process is with the weakness such as bad reliability and bad intensity in the conducting plug, it always fails to meet the requirement from customer, also, the market competition is weak and the production cost is high. Therefore, the improvement of the process for producing via on the integrated circuit substrate is the major concern that every substrate manufacturer focused.

SUMMARY OF THE INVENTION

The primary aspect of the present invention is to provide a pattern formation process for an integrated circuit substrate, which is not employing the conventional method of filling resin material directly in filling process but adapting the metal spray method, the metal vapor deposition method or any combination thereof to form the pattern including circuits and pads and stuff the vias and the PTHs.

The second aspect of the present invention is to provide a pattern formation process for an integrated circuit substrate, which employs the metal spray method, the metal vapor deposition method or any combination thereof to form an entire metal layer on the position of the via, and further to flat the metal layer to fill up the via.

The third aspect of the present invention is to provide a pattern formation process for an integrated circuit substrate, which uses the metal material for filling directly to make the PTH, therefore, the extra capture pad is not necessary, nor is the expensive production facility, meanwhile, the density of the layout of the circuit will be increased and the quality of the substrate is much better.

In order to achieve the objects described above, the present invention is to provide a pattern formation process for an integrated circuit substrate, which comprises the following steps:

(a). placing a protection sheet or a release sheet on the surface of a substrate, on the predetermined position of the circuit substrate, to form a few through hole structures penetrating through the substrate;

(b). placing a protection sheet or a release sheet on the other surface of the substrate that has not been placed with a protection sheet and applying one of the metal spread method, metal vapor deposition method or any combination thereof to proceed the filling process to form the solid through hole;

(c). releasing the protection sheet or the release sheet that have been placed on both surface (top and bottom) of the substrate and to proceed polishing, grinding or etching to make the surfaces plane.

(d). applying one of the metal spray method, the metal vapor deposition method or any combination thereof to form a metal layer on the both surface of the substrate;

(e). applying Photolithograph on the both metal layers to define circuit layer;

(f). placing a dielectric layer; such as photo-imagible dielectric (PID) or laserable dielectric, on the circuit layer;

(g). defining the corresponding position of the vias on the dielectric layer;

(h). applying one of the metal spray method, the metal vapor deposition method or any combination thereof to form a metal layer on the surface of the dielectric layer and stuff the vias that being placed on the dielectric layer;

(i). applying the grinding, the CMP or the SUEP (Surface Uniform Etching Process) on the most outer surface of the substrate surface planarization.

The aforesaid steps can be repeated a few times to build up more dielectric layers, and further, one of the metal spray method, the metal vapor deposition method or any combination thereof can be adapted to form the circuit layer; which is so called the build-up process.

DETAILED DESCRIPTION OF THE PRESENT INVENTION

Figure 1A:
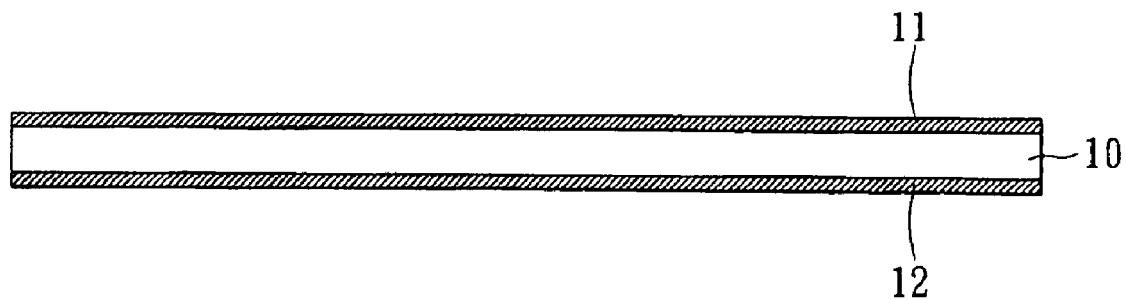
FIG. 1A to FIG. 1E show the pattern formation process for an integrated circuit substrate in prior art.
Figure 1B:
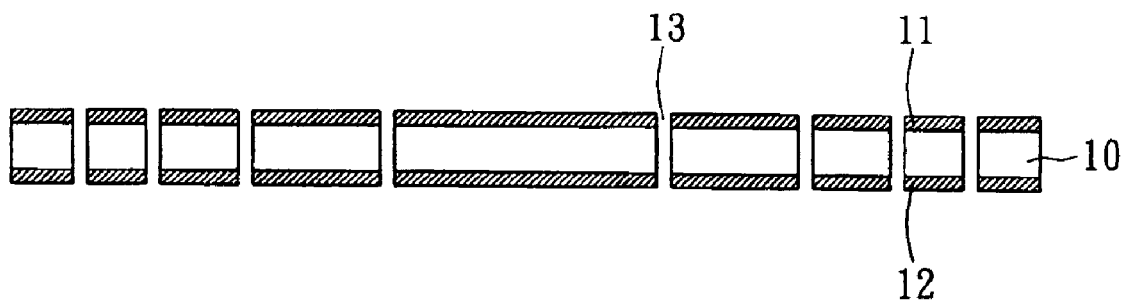
Figure 1C:
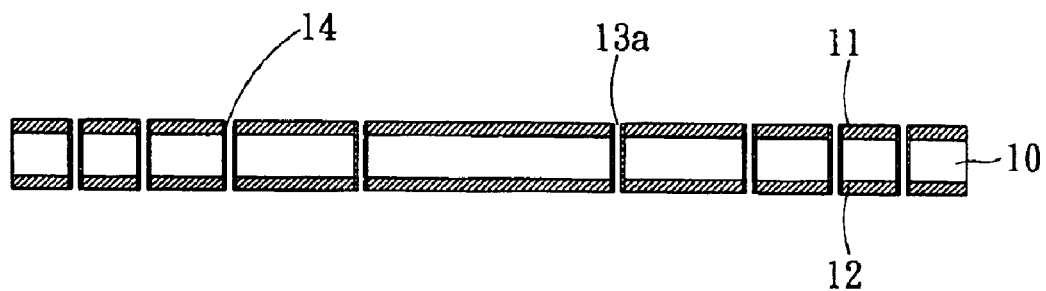
Figure 1D:
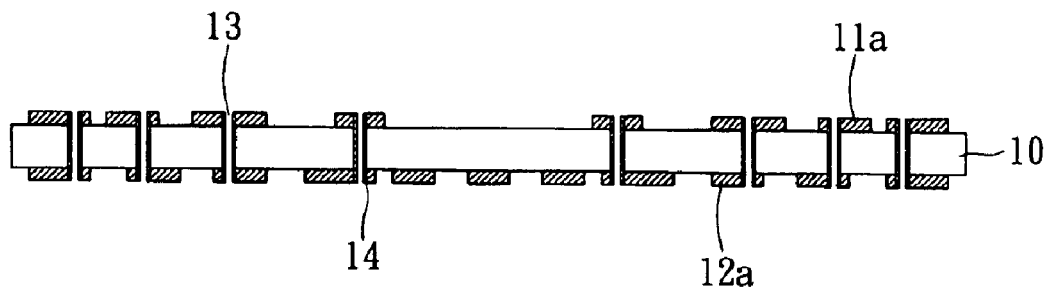
Figure 1E:
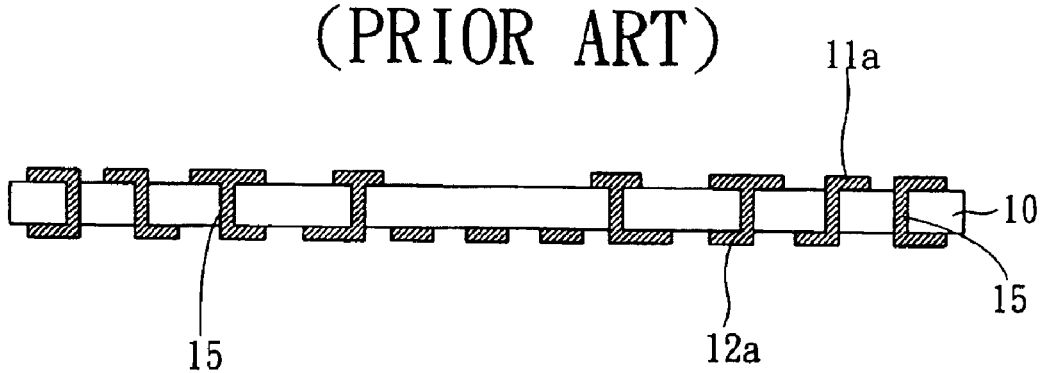

The following embodiments will describe the pattern formation process for an integrated circuit substrate of the present invention about the detailed evolvement, the effect and the other technical characteristics.

Please refer to FIG. 2A to FIG. 2M, which are showing the first embodiment of the pattern formation process for an integrated circuit substrate of the present invention. The steps of forming the pattern and filling the via with conductive material are as follows:

(a) selecting a substrate 110 which can be a ceramic substrate, a plastic substrate or a soft material substrate. The ceramic substrate uses the ceramic material as isolation while the plastic substrate uses the plastic material as isolation. And the plastic substrate is the common one adapted in the industry, generally, the material for the plastic substrate is epoxy resin FR-4, BMI, BT-based resin, teflon, LCP, or polyimide. Then, a protection sheet 111 will be placed on the surface of the substrate 110, and on the predetermined position of the substrate 110, a few through hole structure 113a penetrating through the substrate 110 will be made by the mechanical drilling or the laser process.

Figure 2A:
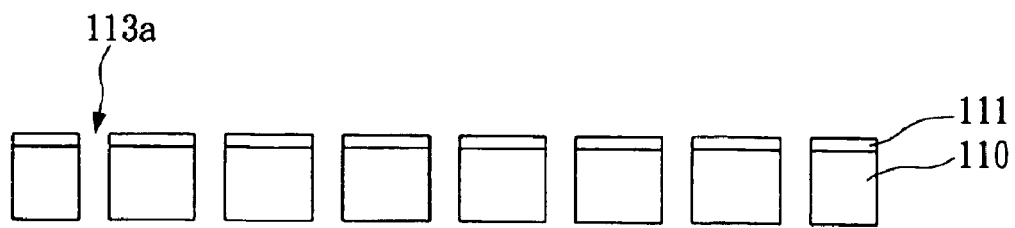
FIG. 2A to FIG. 2M show the first embodiment of the pattern formation process for an integrated circuit substrate of the present invention.
Figure 2B:
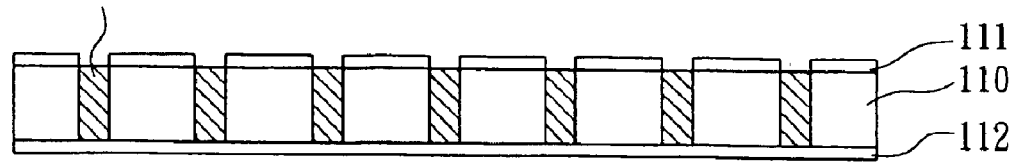
Figure 2C:
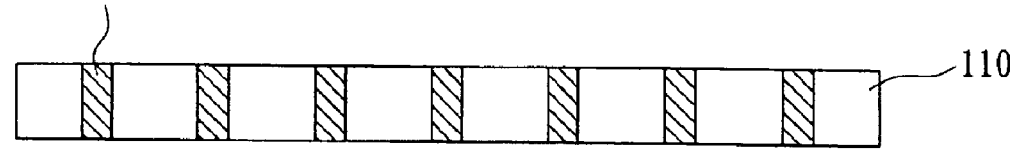
Figure 2D:
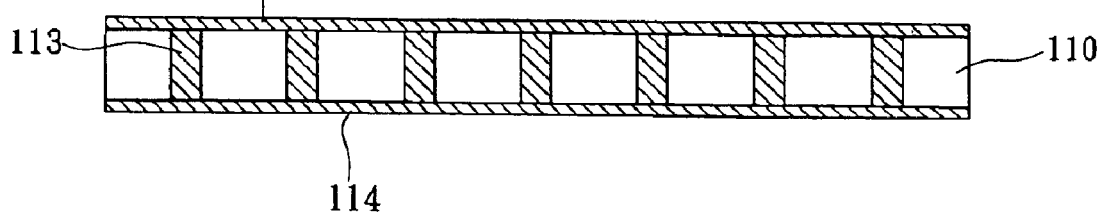
Figure 2E:
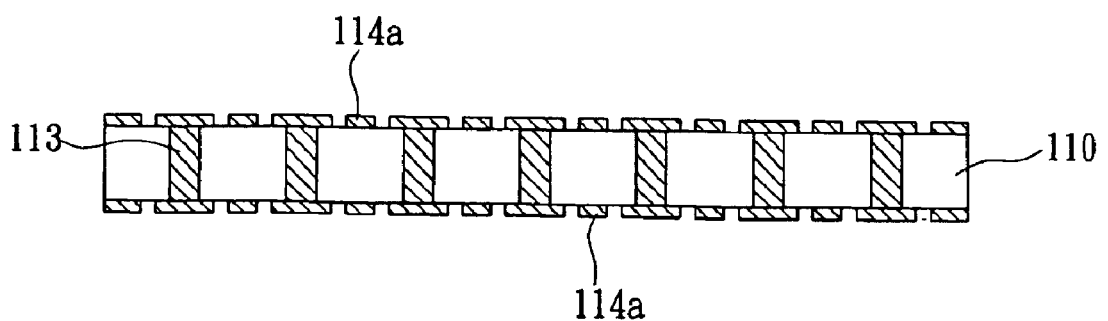
Figure 2F:
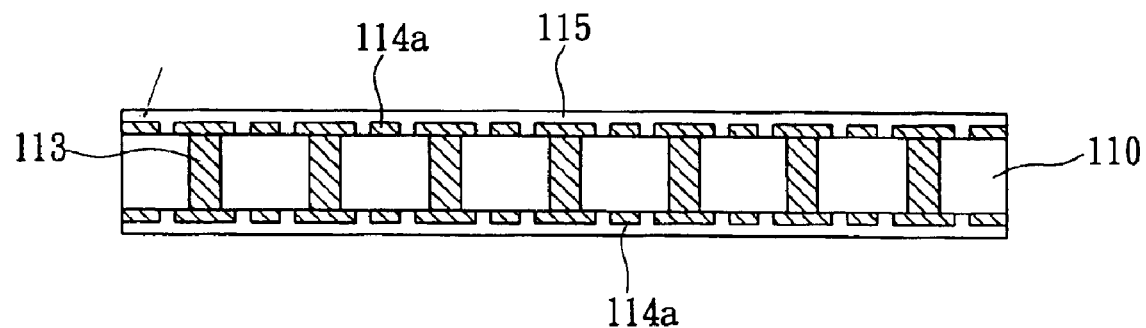
Figure 2G:
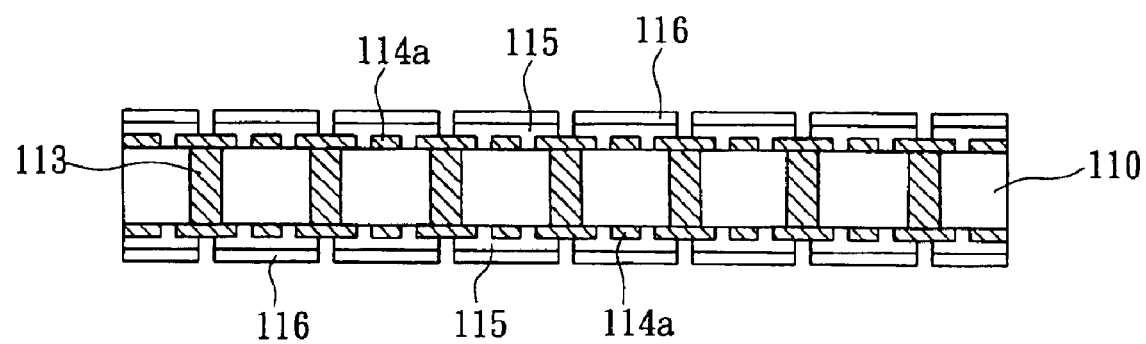
Figure 2H:
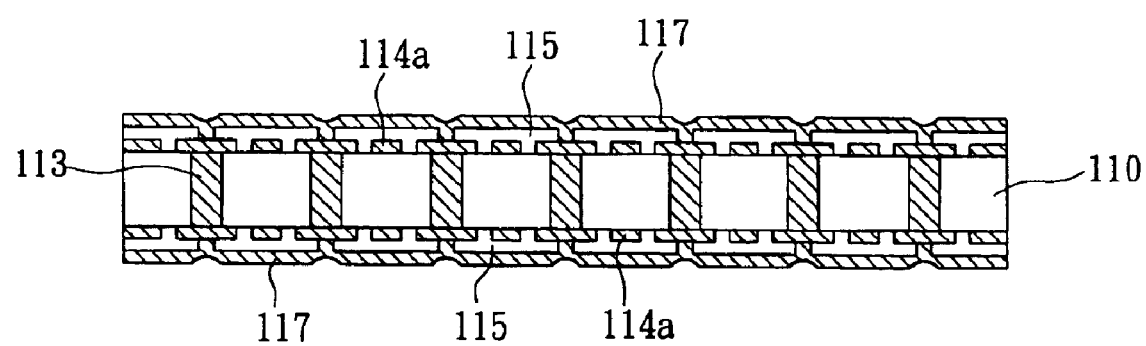
Figure 2I:
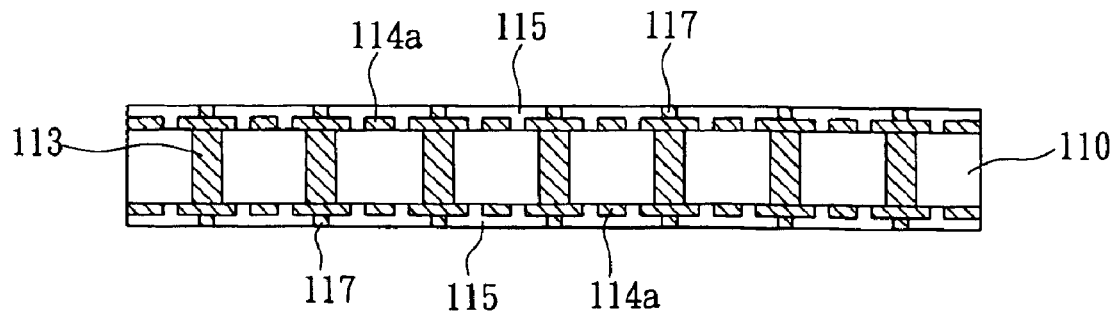
Figure 2J:
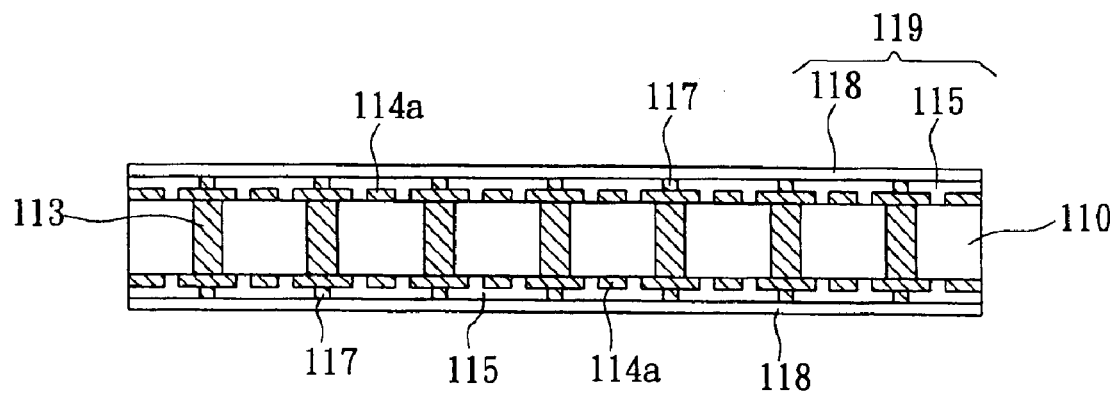
Figure 2K:
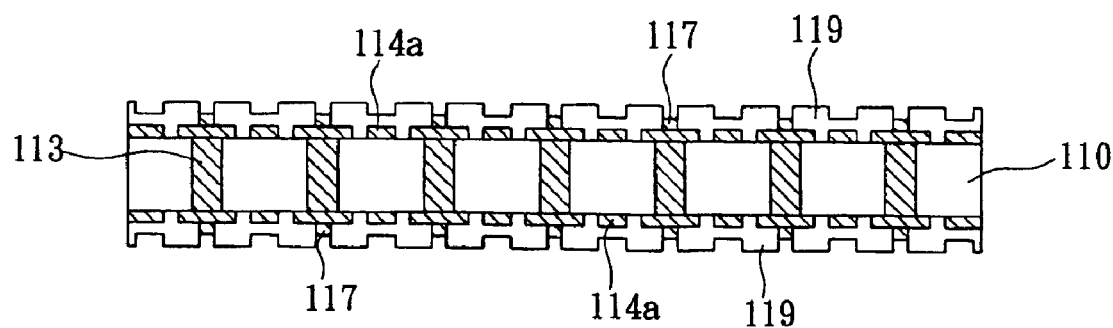

(b). placing a protection release sheet 112 on the other surface (the bottom one) of the circuit substrate 110 that has not been placed with a protection sheet 111 and applying one of the metal spray method, the metal vapor deposition method (ex. the metal vapor evaporation, the metal jet vapor deposition, etc.) or any combination thereof to proceed the filling process on the through hole structure 113a to form the through holes 113. The metal material that being adapted in aforesaid method can be Cu, Al, Zn, Ag, Au, Ni or any other metal, and the metal spray method can be arc melting spray or high velocity particle consolidation;

(c). releasing the protection sheet 111 or the release sheet 112 that have been placed on both surface (top and bottom) of the circuit substrate 110 and proceeding the grinding or the etching or the CMP to make the surfaces plane;

(d). applying one of the metal spray method, the metal vapor deposition method (ex. the metal vapor evaporation, the metal jet vapor deposition, etc.), or any combination thereof to plate a metal layer 114; the metal can be Cu, Al or Zn, Ag, Au, Ni on both surface of the circuit substrate 110;

(e). applying Photolithograph on the both metal layers 114 to define the circuit layer 114a on the surface of the substrate 110;

(f). applying an insulation dielectric layer 115; such as the photo-imagible dielectric (PID) or the laserable dielectric, on the circuit layer 114a; and the number of the dielectric layer can be multiple; it is so called the build-up process;

(g). if the dielectric layer 115 is a laserable one; as shown is FIG. 2G, a release film 116 will be placed for protection purpose, and the vias will be defined on the corresponding position of the metal through holes 113 on the dielectric layer 115, and one of the metal spray method, metal vapor deposition method (ex. metal vapor evaporation method, the metal jet vapor deposition, etc.), or any combination thereof will be applied to fill up the via structure; and then releasing the release film 116 to form a structure shown in FIG. 2I.

(h). if the dielectric layer 115 is a PID one, the via will be defined by photolithography and curing process, the metal layer 117 will be placed by the metal spray method or the metal vapor deposition method (ex. metal vapor evaporation method, the metal jet vapor deposition, etc.); wherein the metal can be Cu, Al, Zn, Ag, Au, Ni or other metal, to fill up the vias that being defined on the corresponding position of the metal through holes 113 as shown in FIG. 2H.

(i). applying the grinding, the CMP or the SUEP on the most outer metal layer 117 of the circuit substrate 110 for the surface planarization as shown in FIG. 2I (j). placing the isolation dielectric layer 118 over the via layer 117, and the dielectric layer 115 and the material of the layer 118 can be a PID one or a laserable one and it should be the same material as used in layer 115 to form a new dielectric layer 119.

(k). if the dielectric layer 118 is a PID one, the opening for the circuit can be defined by the Photolithography and the curing process; if the layer 118 is a laserable one, the opening for the circuit on the dielectric layer 19 can be defined by the laser, but a release film should be placed first for protection, and the release film will be removed when the metal filling process completed.

Figure 2L:
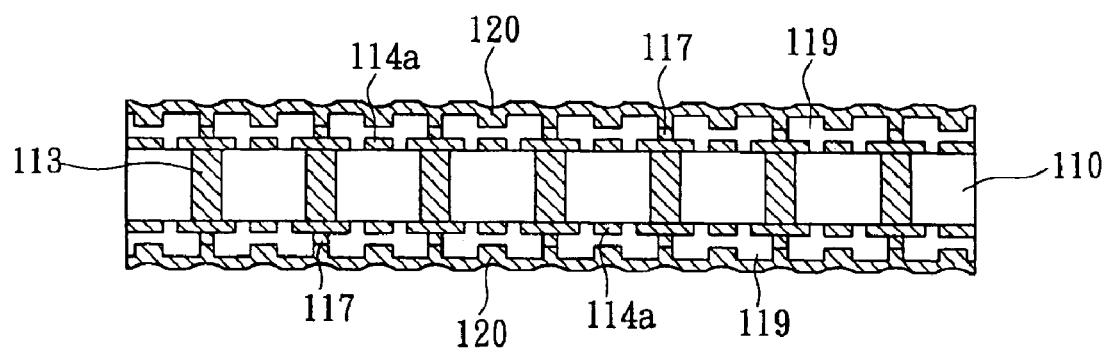
Figure 2M:
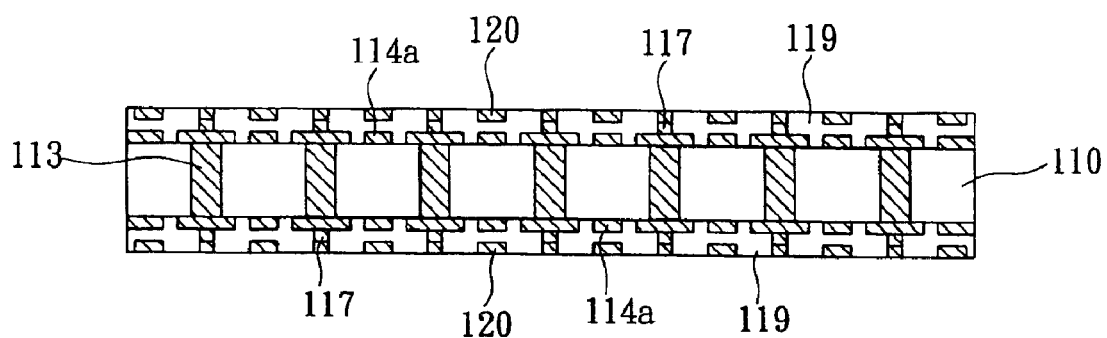

(l). if the dielectric layer 118 is a laserable one, a metal layer 120 will be formed through release film protection on the layer 118 by metal spray method or metal vapor deposition method; wherein the metal can be Cu, Al, Zn, Ag, Au, Ni or other metal, to accomplish the filling up for circuit (FIG. 2M).

(m). if the dielectric layer 118 is a PID one, the grinding, the CMP or the SUEP will be applied on the most outer metal layer 120 and the dielectric 119 of the circuit substrate 110 for planarization (FIG. 2L).

The aforesaid steps can be repeated a few times to build up more dielectric layers, and further one of the metal spread method, metal vapor deposition method (ex. metal vapor evaporation method, the metal jet vapor deposition, etc.), or any combination thereof can be adapted to form the circuit layer; which is so called the build-up process.

Please refer to FIG. 3A to FIG. 3K, which are showing the second embodiment of the pattern formation process for an integrated circuit substrate of the present invention. The steps of manufacturing the via and filling the via with conductive material are as follows:

(a) selecting a substrate 210 which can be a ceramic substrate, a plastic substrate or a soft material substrate. The ceramic substrate uses the ceramic material as isolation while the plastic substrate uses the plastic material as isolation. Then, a protection sheet 211 will be placed on the surface (top one) of the substrate 210, and on the predetermined position of the substrate 210, a few through hole structure 213a penetrating through the substrate 210 will be made by the mechanical drilling or the laser process.

(b). placing a protection release sheet 212 on the other surface (the bottom one) of the circuit substrate 210 that has not been placed with a protection sheet 211, and applying one of the metal spray method, metal vapor deposition method (ex. metal vapor evaporation method, the metal jet vapor deposition, etc.) or any combination thereof to proceed the filling process on the through hole structure 213a to form the through holes 213; the metal material that being adapted in aforesaid method can be Cu, Al, Zn, Ag, Au, Ni or any other metal, and the metal spray method can be arc melting spray or high velocity particle consolidation;

(c). releasing the protection sheet 211 or the release sheet 212 that have been placed on both surface (top and bottom) of the circuit substrate 210, and proceeding the grinding or the etching to make the surfaces plane, (d). placing one isolation dielectric layer 214 on the both top and bottom surface of the substrate 210, and the dielectric layer 214 can be a PID one or a laserable one, (e). if the layer 214 is a laserable one, a release film is over the dielectric layer 214, and the position of the metal vias and the circuit layout on the dielectric layer 214 can be defined by the laser, then, the metal layer 215 will be formed by one of the metal spray method, metal vapor deposition method (ex. metal vapor evaporation method, the metal jet vapor deposition, etc.), or any combination thereof to proceed the filling, and the release film will be removed.

(f). if the dielectric layer 214 is a PID one, a few metal vias and circuit layout will be defined on the dielectric layer 214 by the Photolithography or the curing process; then, the metal layer 215 will be formed by one of the metal spray method, the metal vapor deposition method (ex. metal vapor evaporation method, the metal jet vapor deposition, etc.), or any combination thereof on the layer 214 on the top and bottom surface of the substrate 210 to form the circuit layer 220, wherein the metal can be Cu, Al, Zn, Ag, Au, Ni or other metal.

(g). applying the grinding, the CMP or the SUEP on the metal layer 215 of the circuit substrate 210 to make the surfaces plane.

(h). applying an isolation dielectric layer 216 on the metal layer 215 and the dielectric layer 214, and the material of the layer 216 can be a PID one or a laserable one, and it should be the same material as used in the layer 214 to form a new dielectric layer 217.

(i) if the dielectric layer 217 is a laserable one, a release film is over the dielectric layer 217, and the position of the metal vias and the circuit layout on the dielectric layer 217 can be defined by the laser, then, the metal layer 218 will be formed by one of the metal spray method, the metal vapor deposition method (ex. metal vapor evaporation method, the metal jet vapor deposition, etc.), or any combination thereof to proceed the filling, and then the release film will be removed.

(j). if the dielectric layer 217 is a PID one, a few metal vias and circuits will be defined on the dielectric layer 217 by the Photolithography or the curing process; then, the metal layer 218 will be formed by metal spray method or metal vapor deposition method on the dielectric layer 217 and the metal layer 215; wherein the metal can be Cu, Al, Zn, Ag, Au, Ni or other metal, to fill up the vias that being defined on the corresponding position of the metal through holes 213 on the dielectric layer 217.

(k). applying the grinding, the CMP or the SUEP on the most outer metal layer 218 of the circuit substrate 210 for the surface planarization.

Figure 3A:
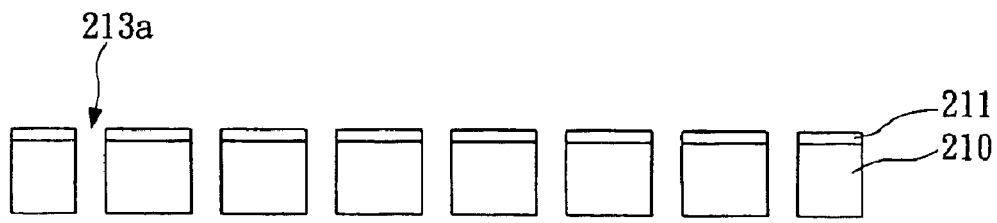
FIG. 3A to FIG. 3L shows the second embodiment of the pattern formation process for an integrated circuit substrate of the present invention.
Figure 3B:
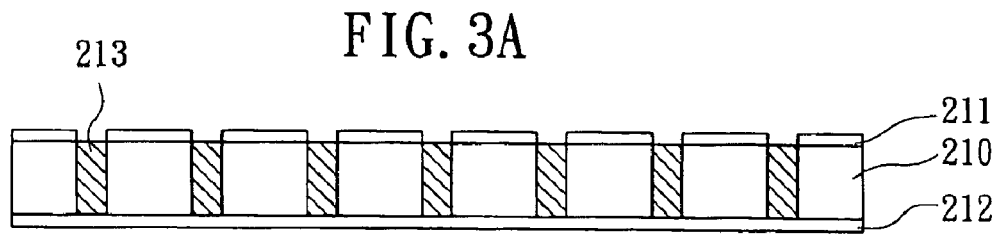
Figure 3C:
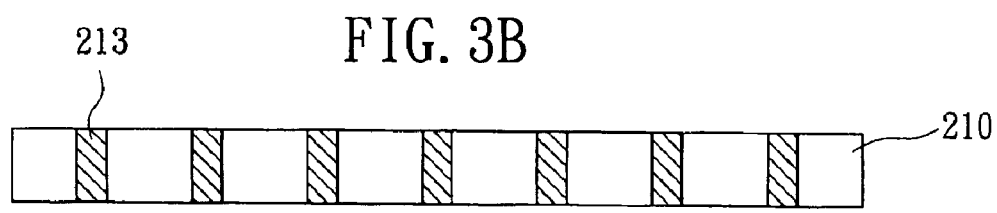
Figure 3D:
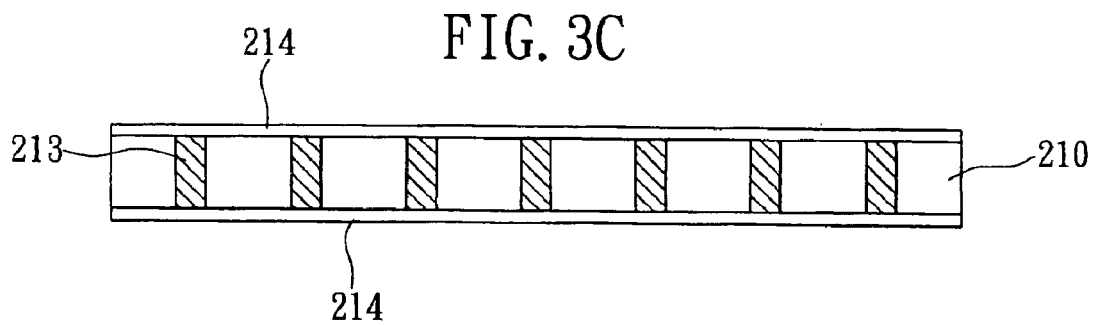
Figure 3E:
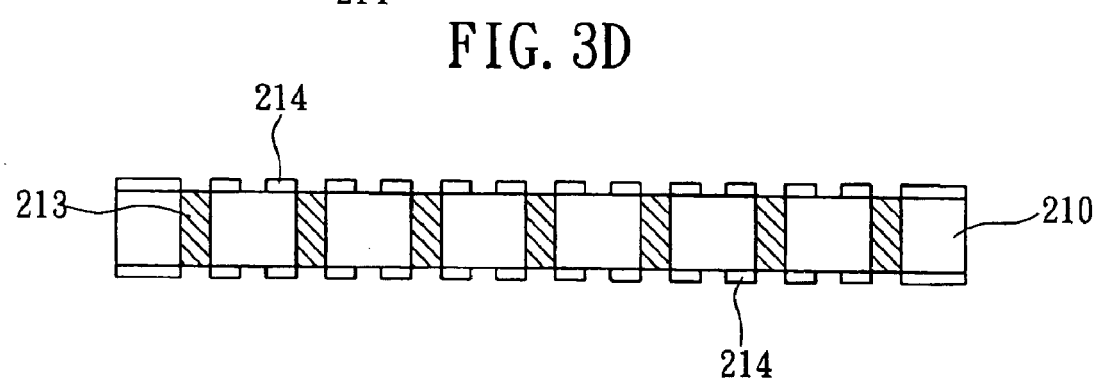
Figure 3F:
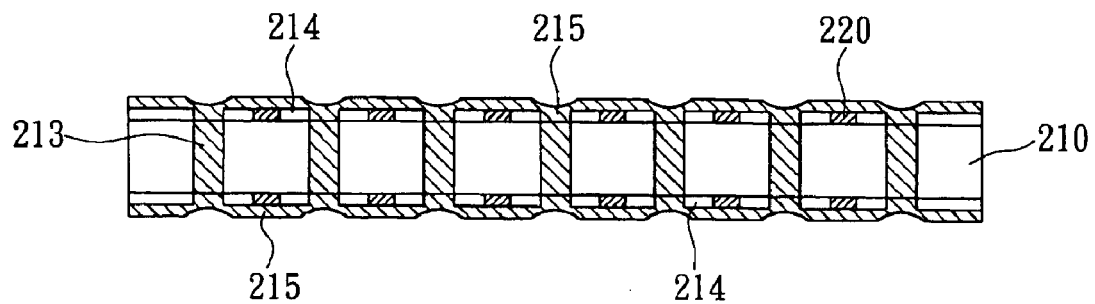
Figure 3G:
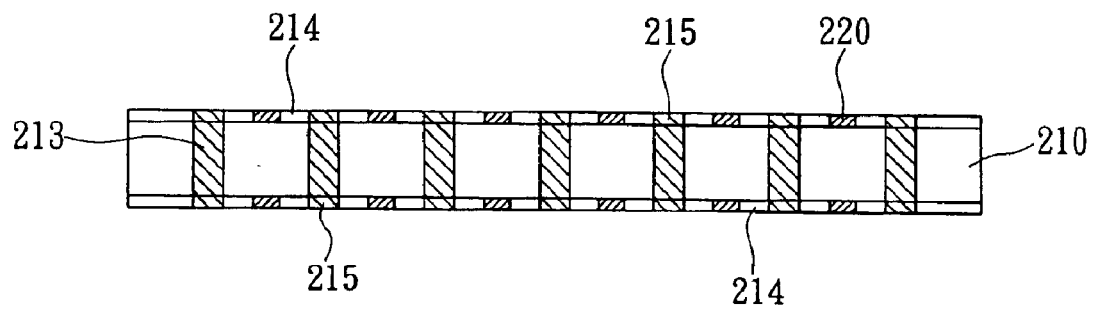
Figure 3H:
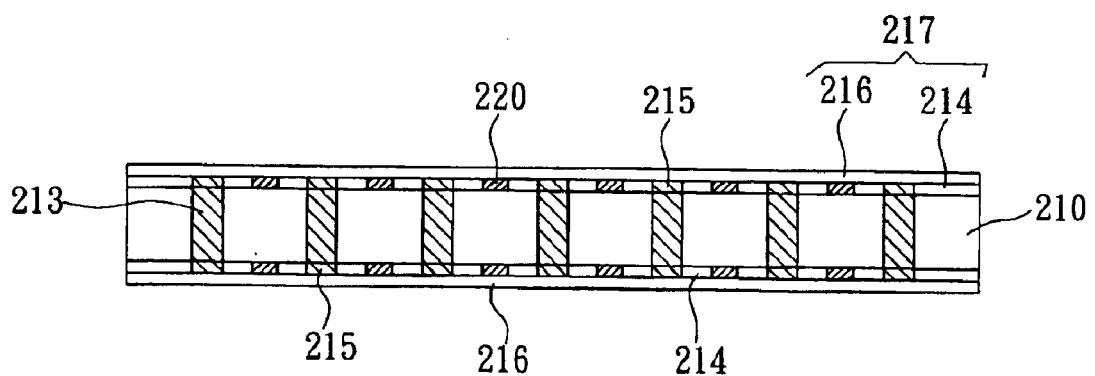
Figure 3I:
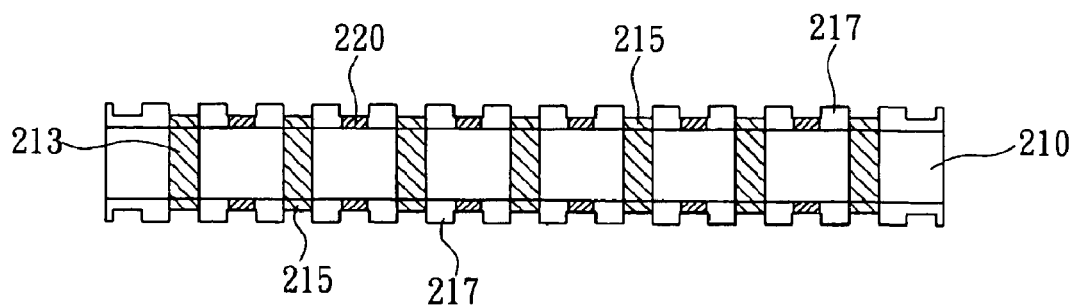
Figure 3J:
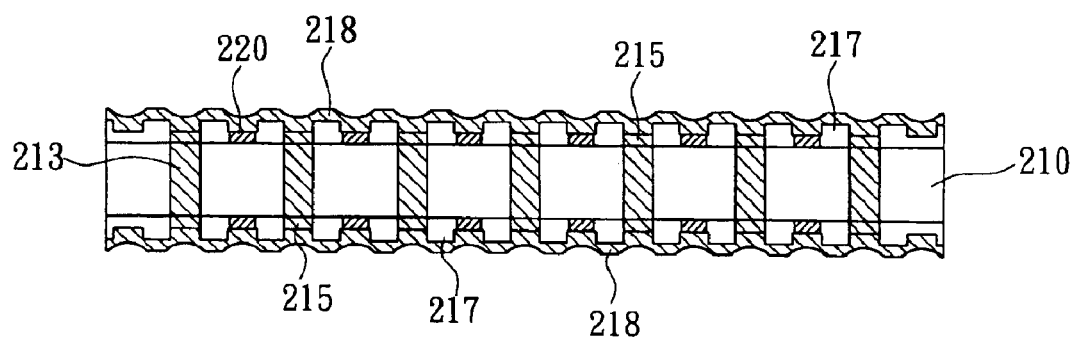
Figure 3K:
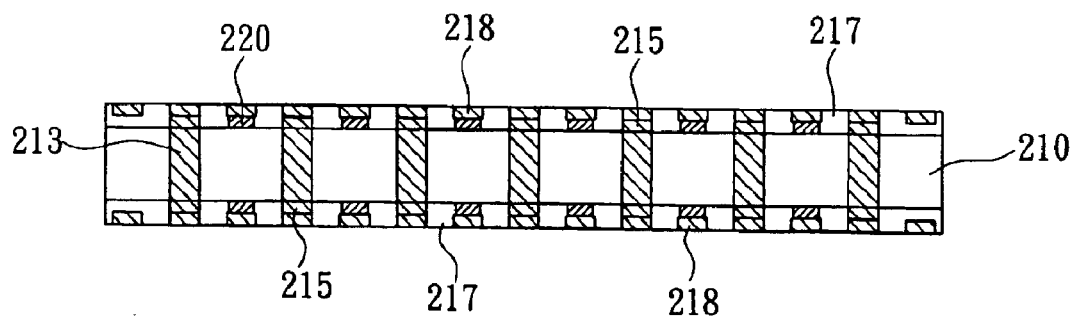
Figure 3L:
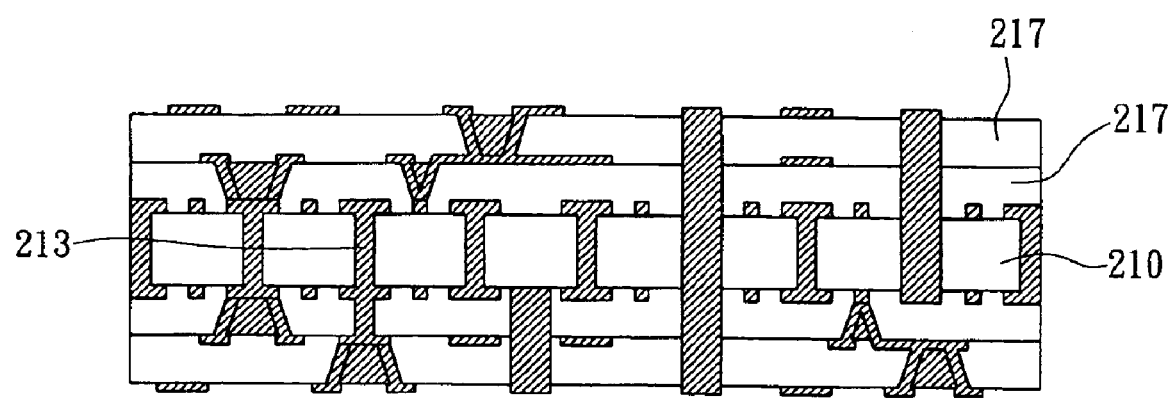

(l). the present embodiment can also apply to the so called build-up process. As shown in FIG. 3L, a few dielectric layers 217 are being stacked on the substrate 210 to form a multiple-layer substrate, and then one of the metal spray method, the metal vapor deposition method (ex. metal vapor evaporation method, the metal jet vapor deposition, etc.), or any combination thereof will be applied on the dielectric layers 217 to form a few circuit layers 220, blind vias, embedded vias and through holes that penetrating the substrate.

The aforesaid steps can be repeated a few times to build up more dielectric layers, and further one of the metal spray method, the metal vapor deposition method (ex. metal vapor evaporation method, the metal jet vapor deposition, etc.), or any combination thereof can be adapted to form the multiple circuit layer, which is so called build-up process.

The major difference in the present invention that differs from prior art is that the present invention adapts one of the metal spray method, the metal vapor deposition method (ex. metal vapor evaporation method, the metal jet vapor deposition, etc.), or any combination thereof, with a release film and a protection sheet, to stuff the via on a substrate. With the present invention, a via with vary small diameter, such as a diameter below 100 $\mu$m, even to 10 $\mu$m, can be made and the quality of the structure of the via is excellent.

Further, the present invention adapts one of the metal spray method, metal vapor deposition method (ex. metal vapor evaporation method, the metal jet vapor deposition, etc.), or any combination thereof to form the entire metal layer, and further adapts proper flatting process to flat and stuff the metal through holes and vias. The manufacturing process is not only much easier and simpler than prior art but also keeps the excellent conductivity and yield rate.

More over, the present invention omits the complex process like photo resist process and adapts the PID or the laserable dielectric directly to define the position of through holes or vias; which make the filling process easier to complete.

The description above is completely illustrating the pattern formation process for an integrated circuit substrate of the present invention. As illustrated, the present invention uses metal material to process the filling up to form through holes and vias; which will not use extra capture pad and expensive facility but highly increase the density of the circuit layout and the quality of substrate. More over, with the present invention, the manufacturing process is much easier and can be wildly used in many fields for various size of substrate, totally overcome the disadvantages in prior art.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

What is claimed is:

1. A conductive through hole formation process on an integrated circuit substrate comprising:
   (a) providing a substrate, and applying a release film on the substrate;
   (b) forming at least one through hole extending through the substrate and the release film;
   (c) applying a metal spray on the entire surface of the release film, and filling up the through hole to form a conductive through hole in the substrate; and
   (d) removing the release film.

2. A conductive through hole formation process on an integrated circuit substrate of claim 1, wherein step (b) is carried out using one of the methods of mechanical drilling and laser drilling.

3. A conductive through hole formation process on an integrated circuit substrate of claim 1, wherein the metal spray is carried out using one of the arc melting spray and the high velocity particle consolidation.

4. A conductive through hole formation process on an integrated circuit substrate of claim 1, further comprising (e) planarizing the substrate.

* * * * *